(12) United States Patent
Guo et al.

(10) Patent No.: US 9,711,636 B2
(45) Date of Patent: Jul. 18, 2017

(54) SUPER-JUNCTION SEMICONDUCTOR DEVICE

(71) Applicant: LITE-ON SEMICONDUCTOR CORP., New Taipei (TW)

(72) Inventors: Jia-Jan Guo, Hsinchu (TW); Chih-Wei Hsu, Taipei (TW); Ju-Hsu Chuang, Nantou County (TW); Shih-Han Yu, Hsinchu (TW)

(73) Assignee: LITE-ON SEMICONDUCTOR CORP., New Taipei (TW)

( * ) Notice: Subject to any disclaimer, the term of this patent is extended or adjusted under 35 U.S.C. 154(b) by 0 days.

(21) Appl. No.: 15/137,386

(22) Filed: Apr. 25, 2016

(65) Prior Publication Data

US 2017/0179276 A1    Jun. 22, 2017

(30) Foreign Application Priority Data

Dec. 18, 2015   (TW) .............................. 104142670 A

(51) Int. Cl.

| | | |
|---|---|---|
| *H01L 31/119* | (2006.01) | |
| *H01L 29/76* | (2006.01) | |
| *H01L 31/113* | (2006.01) | |
| *H01L 29/78* | (2006.01) | |
| *H01L 29/10* | (2006.01) | |
| *H01L 29/06* | (2006.01) | |
| *H01L 29/40* | (2006.01) | |

(52) U.S. Cl.
CPC ...... *H01L 29/7811* (2013.01); *H01L 29/0634* (2013.01); *H01L 29/1083* (2013.01); *H01L 29/1095* (2013.01); *H01L 29/402* (2013.01)

(58) Field of Classification Search
CPC ........... H01L 29/7802; H01L 29/66712; H01L 29/7395; H01L 29/7828; H01L 29/66666; H01L 29/66825; H01L 29/66893; H01L 29/66333; H01L 29/732; H01L 27/0823; H01L 27/10841
USPC .......................... 438/212, 268, 336; 257/302
See application file for complete search history.

(56) References Cited

U.S. PATENT DOCUMENTS

| | | | |
|---|---|---|---|
| 2009/0079002 A1* | 3/2009 | Lee ................... | H01L 29/66712 257/355 |
| 2010/0230745 A1 | 9/2010 | Saito et al. | |

* cited by examiner

*Primary Examiner* — Hsien Ming Lee
(74) *Attorney, Agent, or Firm* — Li & Cai Intellectual Property (USA) Office

(57) ABSTRACT

A super-junction semiconductor device is provided. The super-junction semiconductor device includes a substrate, a drift layer, a field insulator, a floating electrode layer, an isolation layer, and at least one transistor structure. The drift layer includes a plurality of n-type and p-type pillars alternately arranged in parallel to form a super-junction structure. An active region, a termination region and a transition region located therebetween are defined in the drift layer. The field insulator disposed on a surface of the drift layer covers the termination region and a portion of the transition region. The floating electrode layer disposed on the field insulator partially overlaps with the termination region. The transistor structure includes a source conductive layer extending from the active region to the transition region and superimposed on a portion of the floating electrode layer. The source conductive layer is isolated from the floating electrode layer by the isolation layer.

13 Claims, 4 Drawing Sheets

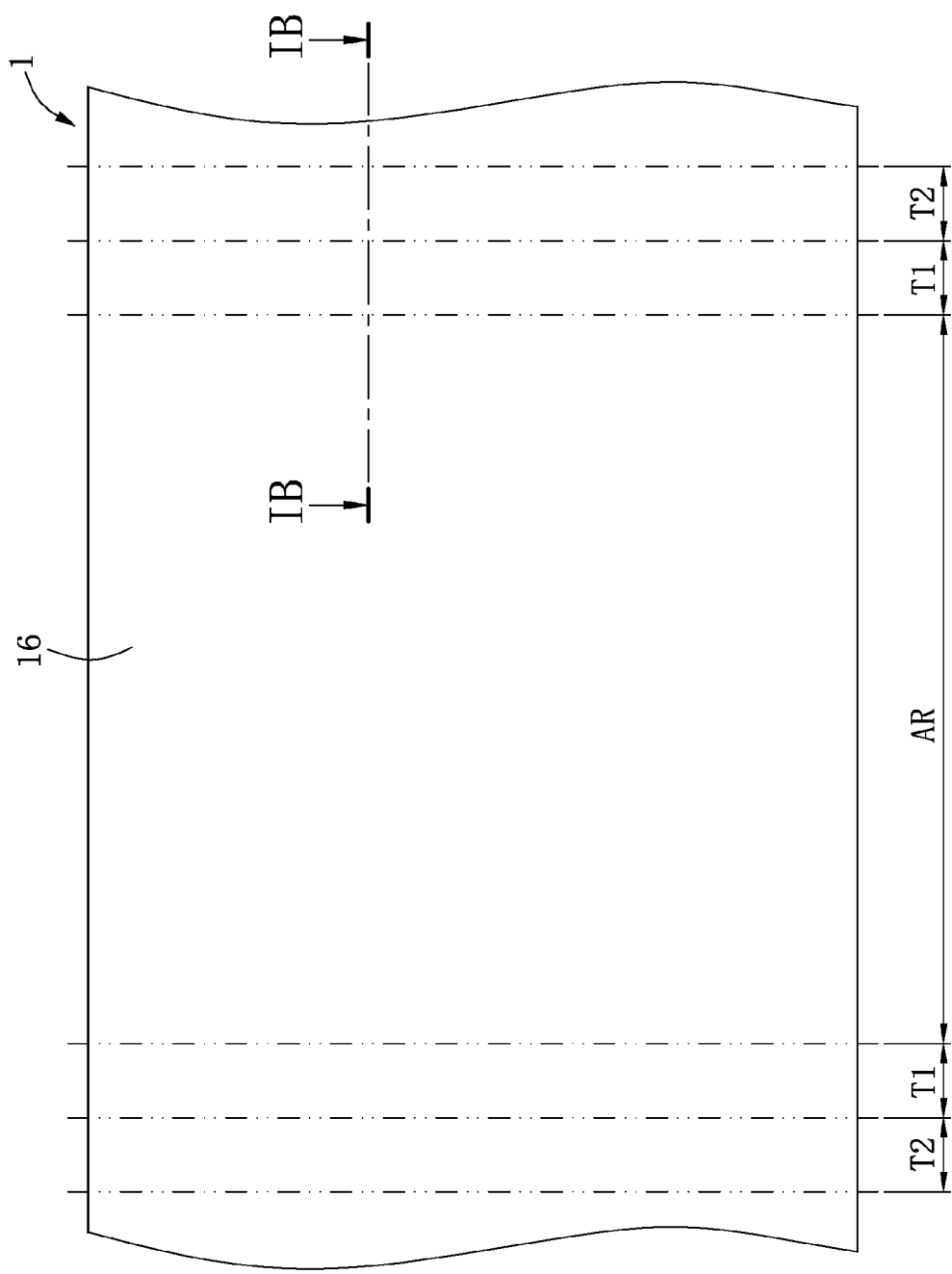

SUPER-JUNCTION SEMICONDUCTOR DEVICE

BACKGROUND OF THE INVENTION

1. Field of the Invention

The instant disclosure relates to a semiconductor device; in particular, to a super junction semiconductor device.

2. Description of Related Art

In the field of medium or high voltage power semiconductor devices, the super junction has been widely integrated in power semiconductor devices. For example, super junction transistors provide a way to achieve low on-resistance (Rds-on), while maintaining a high off-state breakdown voltage (BV).

Super-junction devices include alternating P-type and N-type doped columns formed in the drift region. In the OFF-state of the MOSFET, the columns completely deplete at relatively low voltage and thus can sustain a high breakdown voltage (the columns deplete laterally, so that the entire p and n columns are depleted).

For a super-junction, the on-resistance (Rds-on) increases in direct proportion to the breakdown voltage (BV), which is a much less dramatic increase than in the conventional semiconductor structure. A super junction device may therefore have significantly lower Rds-on than a conventional MOSFET device for the same high breakdown voltage (BV) (or conversely may have a significantly higher BV than a conventional MOSFET for a given Rds-on).

A super junction device according to the prior art is disclosed, for example, in US Pub. No. 2010230745 A1. The super junction device usually includes an active region and a termination region surrounding the active region. In the OFF-state of the super junction device, the electric field is produced along vertical and horizontal directions of the termination region.

The breakdown voltage of the super junction device may be reduced due to too large electric field intensity along the horizontal direction of the termination region. Accordingly, the termination region has a length in the horizontal direction two times to fourth times greater than a thickness of the epitaxial layer. However, if the termination region has too long length in horizontal direction, the effective region ratio of the super junction device will be reduced, and the on-resistance will increase. The prior art discloses a super-junction device including a guard ring layer within the termination region to prevent the breakdown voltage from being reduced without reducing the effective region ratio. However, the guard ring layer has a complicated pattern resulting in a complex and difficult fabrication process.

SUMMARY OF THE INVENTION

The object of the instant disclosure is to provide a super-junction semiconductor device. By arranging the floating electrode layer in the termination region, the distribution range of the electric field can be enlarged to improve the OFF-state breakdown voltage of the super-junction semiconductor device.

In order to achieve the aforementioned objects, according to an embodiment of the instant disclosure, a super-junction semiconductor device is provided. The super-junction semiconductor device includes a substrate, a drift layer, a field insulator, a floating electrode layer, an isolation layer, and at least one transistor structure. The drift layer disposed on the substrate has a surface at a side opposite to the substrate. The drift layer includes a plurality of n-type pillars and a plurality of p-type pillars extending from the surface toward the substrate and arranged alternately to form a super-junction structure. The drift layer defines an active region, a transition region, and a termination region. The termination region surrounds the transition region and the active region, and the transition region is located between the termination region and the active region. The field insulator is disposed on the surface of the drift layer and covers the termination region and a portion of the transition region. The floating electrode layer is disposed on the field insulator, and has at least one portion positioned in the termination region. The isolation layer is disposed on the floating electrode layer. The transistor structure is formed in the active region and includes a source conductive layer extending from the active region to the transition region, and the source conductive layer is insulated from the floating electrode layer by the isolation layer.

To sum up, in the super-junction semiconductor device in accordance with the instant disclosure, the floating electrode layer arranged in the termination region can enlarge the distribution range of the electric field to improve the OFF-state breakdown voltage of the super-junction semiconductor device. Compared to the prior art, the floating electrode layer of the super-junction semiconductor device provided in the instant disclosure has simpler structure. Additionally, the floating electrode layer and the gated layer of the transistor structure and can be fabricated simultaneously during the process. As such, it is easier to fabricate the floating electrode layer arranged in the termination region to improve the breakdown voltage of the termination region.

In order to further the understanding regarding the instant disclosure, the following embodiments are provided along with illustrations to facilitate the disclosure of the instant disclosure.

BRIEF DESCRIPTION OF THE DRAWINGS

FIG. 1A shows a bottom view of a super junction semiconductor device in accordance with an embodiment of the instant disclosure;

DETAILED DESCRIPTION OF THE PREFERRED EMBODIMENTS

Figure 1B:
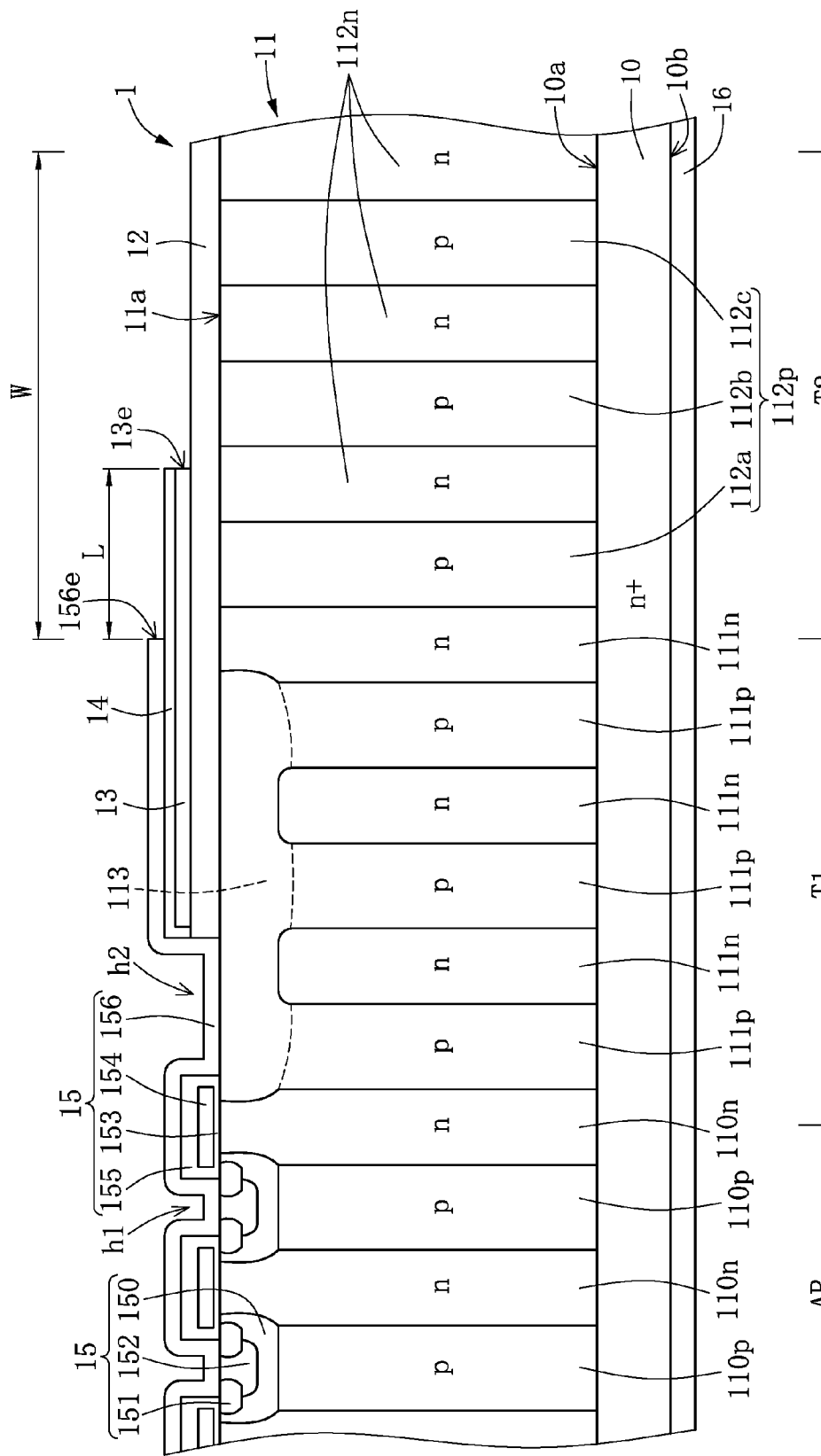
FIG. 1B shows a cross-sectional view taken along a line IB-IB shown in FIG. 1A.

Please refer to FIG. 1A and FIG. 1B. FIG. 1A shows a bottom view of a super-junction semiconductor device in accordance with an embodiment of the instant disclosure, and FIG. 1B shows a cross-sectional view taken along a line IB-IB shown in FIG. 1A.

In the embodiment of the instant disclosure, the super-junction semiconductor device 1 includes a substrate 10, a drift layer 11, a field insulator 12, a floating electrode layer 13, an isolation layer 14, at least one transistor structure 15 and a drain contact pad 16.

As shown in FIG. 1A, the substrate 10 is a semiconductor substrate and has an upper surface 10a and a back surface 10b. The substrate 10 is doped with a higher concentration of first conductivity type impurities to form a first heavily doped region. The first heavily doped region may distribute to a local region or the overall region of the substrate 10 to serve as a drain contact layer. In the instant embodiment, the first heavily doped region distributes to the overall region of the substrate 10, which is only used as an example, but not so as to limit the scope of the invention. The aforementioned drain contact pad 16 is formed on the back surface 10b of the substrate 10 to be electrically connected to an external control circuit.

The aforementioned first conductivity type impurities may be N-type or P-type conductivity impurities. If the substrate 10 is a silicon substrate, the N-type conductivity impurities may be Group V ions such as phosphorus ions or arsenic ions, and the P-type conductivity impurities may be Group III ions such as boron ions, aluminum ions or gallium ions.

The drift layer 11 is disposed on the upper surface 10a of the substrate 10 and doped with a low concentration of first conductivity type impurities. In the instant embodiment, the substrate 10 is a heavily N-type doping ($N^+$) substrate and the drift layer 11 is a lightly N-type doping (N) layer. The drift layer 11 further includes a surface 11a at a side opposite to the substrate 10.

As shown in FIG. 1A and FIG. 1B, the drift layer 11 defines an active region AR, a transition region T1, and a termination region T2. The termination region T2 surrounds the transition region T1 and the active region AR, and the transition region T1 is located between the termination region T2 and the active region AR.

Please refer to FIG. 1B. The drift layer 11 includes a plurality of n-type pillars 110n, 111n, 112n and a plurality of p-type pillars 110p, 111p, 112p arranged alternately to form a super-junction structure. Furthermore, the n-type pillars 110n, 111n, 112n and the p-type pillars 110p, 111p, 112p extend along a circuit flow direction, i.e., extend from the surface 11a toward the substrate 10 and are arranged in the active region AR, the transition region T1, and the termination region T2.

When the super-junction semiconductor device 1 is in the ON state, the n-type pillars 110n, 111n, 112n and the p-type pillars 110p, 111p, 112p can provides charges. When the super-junction semiconductor device 1 is in the OFF state, the n-type pillars 110n, 111n, 112n and the p-type pillars 110p, 111p, 112p are depleted to each other in the horizontal direction so as to balance the charges in the drift layer 11. As such, the super-junction semiconductor device 1 can have higher breakdown voltage under the condition of relatively lower on-resistance.

At least one p-type pillar 111p is arranged in the transition region T1. In the embodiment shown in FIG. 1B, three pairs of p-type pillars 111p and n-type pillars 111n are arranged alternately in the transition region T1. In addition, in the instant embodiment, a p-well region 113 formed in the drift layer 11 is located in the transition region T1 and adjacent to the surface 11a. The p-well region 113 connects among the three p-type pillars 111p. That is, the p-well region 113 is formed at one side of the p-type pillars 111p that is closer to the surface 11a. The number and position of the p-well region 113 is adjustable according to practical requirements, and the instant disclosure is not limited thereto.

Figure 2:
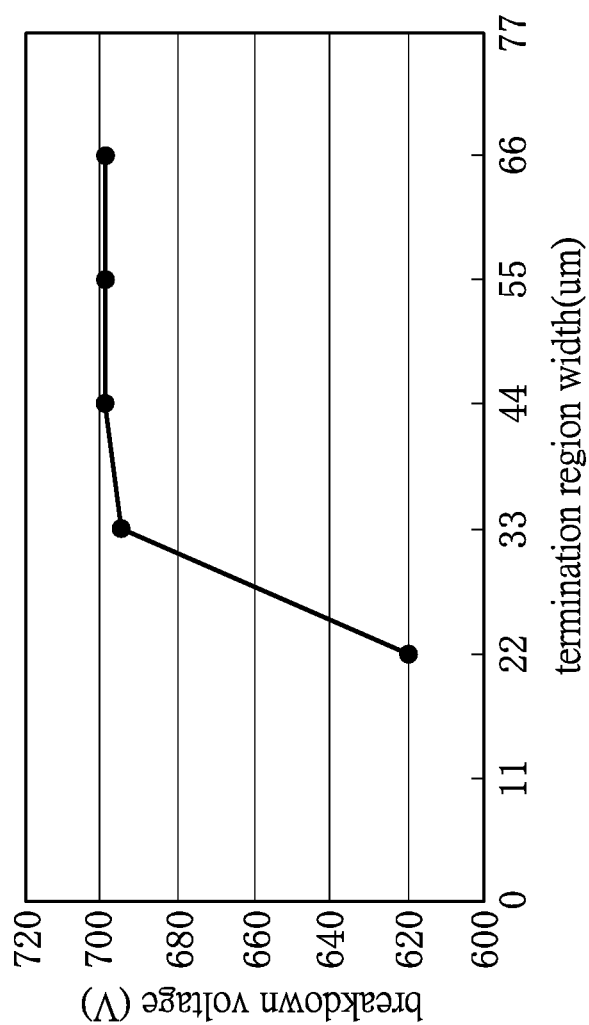
FIG. 2 shows a relationship diagram illustrating a relationship between a termination region width and a breakdown voltage.

Notably, the termination region T2 has a width in the horizontal direction, and the width of the termination region T2 can impact the breakdown voltage of the super-junction semiconductor device 1. Please refer to FIG. 2, which shows a relationship diagram illustrating a relationship between a termination region width and a breakdown voltage. As shown in FIG. 2, under the condition that the width of the termination region T2 is less than 30 μm, the width of the termination region T2 has a larger impact on the breakdown voltage. Specifically, the breakdown voltage of the super-junction semiconductor device increases with the increase of the width of the termination region T2. Under the condition that the width of the termination region T2 is larger than 30 μm, the breakdown voltage may be maintained or slightly increased even if the width of the termination region T2 is increased.

Accordingly, in one embodiment, the width of the termination region T2 ranges from 30 μm to 70 μm so that the breakdown voltage of the super-junction semiconductor device 1 is larger than 650V. In the embodiment shown in FIG. 1B, at least three pairs of the p-type pillars 112p and the n-type pillars 112n are formed in the termination region T2. In another embodiment, at least five pairs of the p-type pillars 112p and the n-type pillars 112n are formed in the termination region T2.

In the embodiment shown in FIG. 1B, the termination region T2 has a first p-type pillar 112a, a second p-type pillar 112b, and a third p-type pillar 112c formed therein and arranged in a direction from the position near the transition region T1 to another position far away from the transition region T1. Furthermore, the two adjacent first and second p-type pillars 112a and 112b (and the second and third p-type pillars 112b and 112c) are spaced apart from each other by one of the n-type pillars 112n.

Notably, the formation of the n-type and p-type pillars 111n, 111p, 112n, 112p in the transition region T1 and the termination region T2 can improve the electric field distribution to increase the breakdown voltage of super-junction semiconductor device 1.

In addition, the process of forming the super-junction structure in the drift layer 11 may include the steps of forming a lightly-doped layer of the first conductivity type on the upper surface 11a of the substrate 10; subsequently, forming a plurality of trenches vertically extending from the surface 11a; and forming a semiconductor layer of the second conductivity type in the trenches so that the p-type pillars 110p, 111p, and 112p and the n-type pillars 110n, 111n, and 112n are formed alternately.

The field insulator 12 is disposed on the surface 11a of the drift layer 11 and covers the termination region T2 and a portion of the transition region T1. The floating electrode layer 13 is disposed on the field insulator 12 and extends from the transition region T1 to the termination region T2, and the isolation layer 14 is disposed on the floating electrode layer 13. That is, the floating electrode layer 13 is interposed between the isolation layer 14 and the field insulator 12. In one embodiment, the field insulator 12 and the isolation layer 14 are both made of oxide materials.

In the instant embodiment, a portion of the field insulator 12, a portion of the floating electrode layer 13 and a portion of the isolation layer 14 are stacked over two pairs of the p-type pillars 111p and n-type pillars 111n, which are located in the transition region T1 and closest to the termination region T2.

Furthermore, another portion of the floating electrode layer 13 and another portion of the isolation layer 14 located in the termination region T2 are stacked over the first p-type pillar 112a and the n-type pillar 112n adjacent to the first p-type pillar 112a. It is worth noting that the position of the floating electrode layer 13 and a protruding length of the floating electrode layer 13 from the edge of the transition region T1 to the termination region T2 can affect the breakdown voltage of the super-junction semiconductor device 1 in a simulation result, which will be described in detail in the following description.

A plurality of transistor structures 15 is located in the active region AR, and each of the transistor structures 15 includes a body region 150, a source region 151, a gate insulating layer 153, a dielectric layer 155, and a source conductive layer 156.

The body region 150 has a conductivity type opposite to that of the drift layer 11 and the substrate 10. For example, the substrate 10 and the drift layer 11 are doped to have n-type conductivity, and the body region 150 is doped to have p-type conductivity. In addition, each body region 150 correspondingly connects one of the p-type pillars 110$p$ in the active region AR. To be more specific, the body region 150 is connected to an end portion of the p-type pillar 110$p$ near to the surface of the drift layer 11.

At least one source region 151 is formed in each of the body regions 150 and the source region 151 has a conductivity type opposite to that of the body region 150, whereas the source region 151 has the same conductivity type as that of the drift layer 11 and the substrate 10. In the embodiment shown in FIG. 1B, two source regions 151 are formed in each of the body region 150$s$. Furthermore, the source region 151 is spaced apart from the n-type pillar 110$n$ by the body region 150.

In the instant embodiment, each of the transistor structures 15 further includes a doped contact region 152 which has a conductivity type opposite to the source region 151. In the embodiment shown in FIG. 1B, the source region 151 is a highly doped n-type region, and the doped contact region 152 is a highly doped p-type region. The doped contact region 152 is located between two adjacent source regions 151 in the same body region 150.

Both of the gate insulating layer 153 and the gate electrode layer 154 are disposed on the surface 11$a$ of the drift layer 11, and the gate electrode layer 154 is insulated from the drift layer 11 by the gate insulating layer 153. Furthermore, in the instant embodiment, the gate electrode layers 154 are disposed on the gate insulating layer 153 corresponding to the position of each n-type pillar 110$n$ in the active region AR. The gate electrode layer 154 is arranged to partially overlap with the source regions 151 formed in the body region 150.

The dielectric layer 155 covers the gate electrode layer 154 and has a plurality of first contact windows h1 (two first contact windows are shown in FIG. 1B) and a plurality of second contact window h2 (one second contact window h2 is shown in FIG. 1B) formed therein. The first contact windows h1 respectively correspond to the positions of the doped contact regions 152, and the second contact windows h2 respectively correspond to the position of the p-well region 113. That is, before the source conductive layer 156 is formed, a portion of the doped contact region 152 and a portion of the source regions 151 are exposed on the surface 11$a$ of the drift layer 11 through the first contact windows h1, and a portion of the p-well region 113 is exposed on the surface 11$a$ of the drift layer 11 through the second contact windows h2.

The source conductive layer 156 is disposed on the dielectric layer 155 and extends from the active region AR to the transition region T1. The source conductive layer 156 is electrically connected to each of the source regions 151 and each of the doped contact regions 152 through the first contact windows h1. Furthermore, the source conductive layer 156 is in contact with the surface 11$a$ of the drift layer 11 through the second contact window h2 and electrically connected to the p-well region 113 in the transition region T1.

Notably, a portion of the source conductive layer 156 extending beyond the active region AR to the transition region T1 covers the isolation layer 14 and partially overlaps with the floating electrode layer 13. However, the source conductive layer 156 is insulated from the floating electrode layer 13 by the isolation layer 14 instead of directly in contact with the floating electrode layer 13.

The source conductive layer 156 extends to the transition region T1 and beyond the p-well region 113. To be more specific, an end 156$e$ of the source conductive layer 156 is located close to an interface between the transition region T1 and the termination region T2. In the instant embodiment, the end 156$e$ of the source conductive layer 156 is located at a vertical plane located between the p-type pillar 111$p$ in the transition region T1 and the first p-type pillar 112$a$ in the termination region T2.

In one embodiment, the source conductive layer 156 can be selected from the group consisting of titanium (Ti), platinum (Pt), tungsten (W), nickel (Ni), chromium (Cr), molybdenum (Mo), tin (Sn), and the metal silicide thereof.

As shown in FIG. 1B, a portion of the floating electrode layer 13 located in the termination region T2 does not overlap with the source conductive layer 156. Accordingly, a distance between the end 156$e$ of the source conductive layer 156 and the end 13$e$ of the floating electrode layer 13 is the protruding length L of the floating electrode layer 13 from the source conductive layer 156.

It is worth noting that under the situation that a reverse bias is applied on the super-junction semiconductor device 1 so that the super-junction semiconductor device 1 is in the OFF-state, the electric field distribution in the termination region T2 can be enlarged due to the coupling effect between the floating electrode layer 13 and source conductive layer 156, such that the breakdown voltage of the super-junction semiconductor device 1 can be improved.

If the end 13$e$ of the floating electrode layer 13 is located too close the transition region T1, the enlargement of the electric field distribution would be not enough to improve the breakdown voltage of the super-junction semiconductor device 1.

Furthermore, the strength of the electric field at the region close to the end 13$e$ of the floating electrode layer 13 may be enhanced due to the coupling effect between the floating electrode layer 13 and the source conductive layer 156. Accordingly, if the end 13$e$ of the floating electrode layer 13 is located too deep within the termination region T2, i.e., the end 13$e$ of the floating electrode layer 13 is located too far away from the interface between the termination region T2 and the transition region T1, it would result in the occurrence of the breakdown in the termination region T2 during the operation of the super-junction semiconductor device 1, degrading the ability of the super-junction semiconductor device 1 to sustain voltage.

Accordingly, in one embodiment, the end 13$e$ of the floating electrode layer 13 is located at a vertical plane between the first and second p-type pillars 112$a$, 112$b$ to avoid the breakdown occurring in the termination region T2 and improve the breakdown voltage of the super-junction semiconductor device 1.

Figure 3:
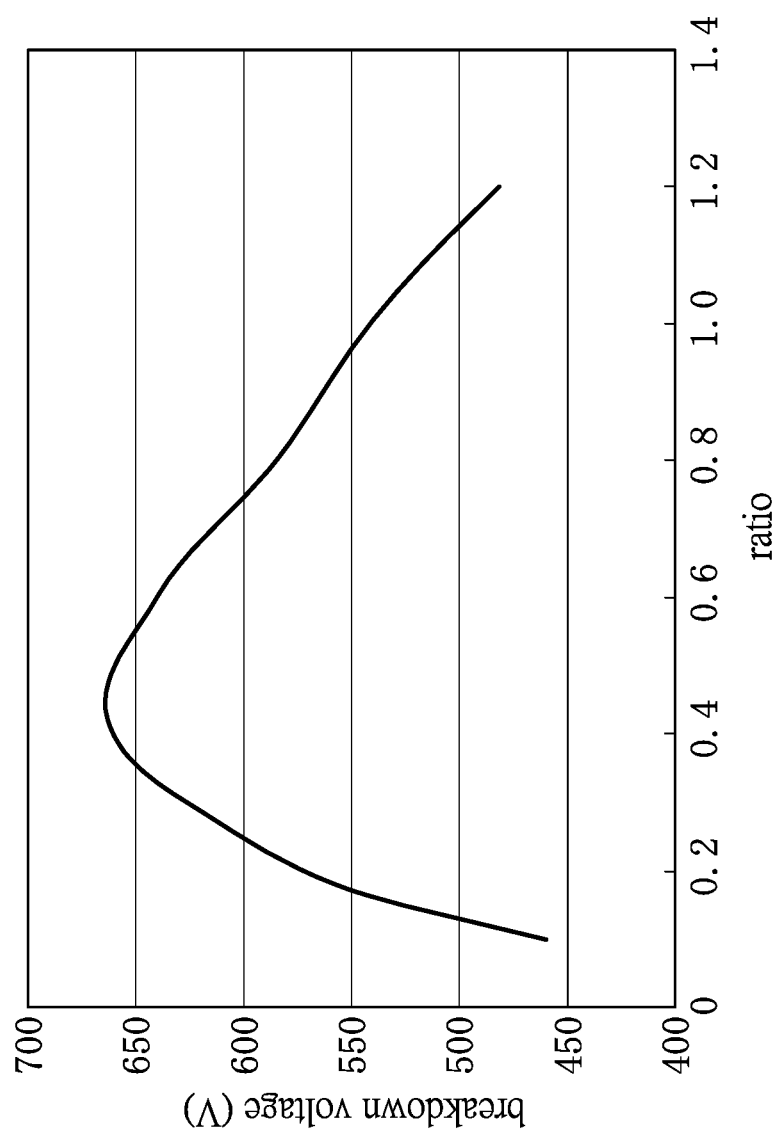
FIG. 3 shows a relationship diagram illustrating a relationship between a breakdown voltage and a ratio between a protruding length of the floating electrode layer from the source conductive layer and a width of the termination region.

Please refer to FIG. 3. FIG. 3 shows a relationship diagram illustrating a relationship between a breakdown voltage and a ratio (L/W) between a protruding length L of the floating electrode layer from the source conductive layer and a width W of the termination region. The values of the breakdown voltage of the super-junction semiconductor device 1 under different ratios, as shown in FIG. 3, are simulated under the conditions of a width W of about 33 μm.

As shown in FIG. 3, in the beginning the breakdown voltage of the super-junction semiconductor device increases with the increase of the ratio, i.e., with the increase of the protruding length L of the floating electrode layer 13 in the termination region T2. When the ratio is larger than 0.3, a simulated breakdown voltage of larger than 660V can be obtained. However, with the ratio increases to be larger than 0.75, the simulated breakdown voltage decreases to lower than 600V. When the ratio is increased to larger than 0.95, the simulated breakdown voltage decreases to lower than 550V, and the breakdown of the super-junction semiconductor device occurs in the termination region T2.

Additionally, the peak of the curve is shifted towards the left under the condition of larger width W of the termination region T2. As such, the protruding length L of the floating electrode layer 13 in the termination region T2 and the width W of the termination region T2 can be designed according to the application field and the desired sustain voltage of the super-junction semiconductor device.

For example, the ratio between the protruding length L of the floating electrode layer 13 from the source conductive layer 156 and the width W of the termination region T2 can range from 0.1 to 0.8, such that the breakdown voltage of the super-junction semiconductor device is larger than 660V. The range of the aforementioned ratio can be determined according to the width of the termination region T2.

Additionally, it is worth noting that without the deposition of the floating electrode layer 13, a thickness of the field insulator of at least 2.5 μm is required to avoid the occurrence of the breakdown in the termination region T2 due to too large electric field strength. However, the thickness of the field insulator 12 can be less than half an original thickness (2.5 μm) due to the arrangement of the floating electrode layer 13. In one embodiment of the instant disclosure, the thickness of the field insulator 12 can range from 0.6 to 2.0 μm.

In another embodiment, during the manufacturing method of the super-junction semiconductor device 1 of the embodiment, the floating electrode layer 13 can be in step with the gate electrode layer 154 in the active region AR by the same deposition and etching processes. As such, the floating electrode layer 13 and the gate electrode layer 154 can be made of the same materials, such as polysilicon, and have the same thickness. Similarly, the isolation layer 14 can be in step with the dielectric layer 155 in the active region AR by the same deposition and etching processes. Accordingly, the isolation layer 14 and dielectric layer 155 can be made of the same materials and have the same thickness.

To sum up, in the super-junction semiconductor device in accordance with the instant disclosure, the floating electrode layer arranged in the termination region can enlarge the distribution range of the electric field to improve the OFF-state breakdown voltage of the super-junction semiconductor device. Compared to the prior art, the floating electrode layer of the super-junction semiconductor device provided in the instant disclosure has simpler structure, but the required breakdown voltage also can be achieved.

Additionally, the floating electrode layer can be in step with the gated layer of the transistor structure during the processes. As such, the other new process for fabricating the floating electrode layer does not need to be added. It is easier to fabricate the floating electrode layer arranged in the termination region to improve the breakdown voltage of the termination region.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A super junction semiconductor device comprising:
a substrate;
a drift layer disposed on the substrate and having a surface at a side opposite to the substrate, wherein the drift layer includes a plurality of n-type pillars and a plurality of p-type pillars extending from the surface toward the substrate and arranged alternately to form a super-junction structure, and the drift layer defines an active region, a termination region surrounding the active region, and a transition region between the active region and the termination region;
a field insulator disposed on the surface and covering the termination region and a portion of the transition region;
a floating electrode layer disposed on the field insulator, wherein the floating electrode layer partially overlaps with the termination region;
an isolation layer disposed on the floating electrode layer; and
at least one transistor structure located in the active region, wherein the transistor structure includes at least one source conductive layer extending from the active region to the transition region, a portion of the source conductive layer covers the isolation layer and partially overlaps with the floating electrode layer in a direction perpendicular to the surface, and the source conductive layer is insulated from the floating electrode layer by the isolation layer.

2. The super-junction semiconductor device according to claim 1, wherein the floating electrode layer extends from the transition region to the termination region, a portion of the floating electrode layer located in the termination region does not overlap with the source conductive layer, and another portion of the floating electrode layer in the transition region overlaps with the source conductive layer.

3. The super-junction semiconductor device according to claim 1, wherein the drift layer includes a first p-type pillar, a second p-type pillar, and a third p-type pillar formed in the termination region and arranged in a direction from a position near to the transition region to another position far away from the transition region.

4. The super-junction semiconductor device according to claim 3, wherein an end of the floating electrode layer is located at a vertical plane between the first p-type pillar and the second p-type pillar.

5. The super-junction semiconductor device according to claim 1, wherein an end of the source conductive layer is located close to an interface between the transition region and the termination region.

6. The super-junction semiconductor device according to claim 1, wherein the drift layer includes at least one p-type pillar and a p-well region in the transition region, the p-well is connected to an end portion of the p-type pillar near to the surface of the drift layer.

7. The super-junction semiconductor device according to claim 6, wherein a portion of the source conductive layer is directly in contact with the surface to be electrically connected to the p-well region.

8. The super-junction semiconductor device according to claim 1, wherein the field insulator has a thickness ranging from 0.6 µm to 2.0 µm.

9. The super-junction semiconductor device according to claim 1, wherein the transistor structure further comprises:
a body region connected to one of the p-type pillars in the active region;
at least one source region formed in the body region and having a conductivity type opposite to that of the body region, wherein the source region is insulated from the n-type pillar by the body region;
a gate insulating layer disposed on the surface;
a gate electrode layer disposed on the gate insulating layer and corresponding to a position of the n-type pillar; and
a dielectric layer disposed on the gate electrode layer and having at least one contact window formed therein, wherein the source conductive layer covers the dielectric layer to be insulated from the gate electrode layer, and the source conductive layer is electrically connected to the source region through the contact window.

10. The super-junction semiconductor device according to claim 9, wherein the gate electrode layer has the same thickness as a thickness of the floating electrode layer, and the dielectric layer has the same thickness as a thickness of the isolation layer.

11. The super-junction semiconductor device according to claim 1, wherein a portion of the floating electrode layer in the transition region has a protruding length and a ratio between the protruding length and a width of the termination region ranges from 0.1 to 0.8.

12. A super junction semiconductor device comprising:
a substrate;
a drift layer disposed on the substrate and having a surface at a side opposite to the substrate, wherein the drift layer includes a plurality of n-type pillars and a plurality of p-type pillars extending from the surface toward the substrate and arranged alternately to form a super-junction structure, and the drift layer defines an active region, a termination region surrounding the active region, and a transition region between the active region and the termination region;
a field insulator disposed on the surface and covering the termination region and a portion of the transition region;
a floating electrode layer disposed on the field insulator, wherein the floating electrode layer partially overlaps with the termination region, wherein a portion of the floating electrode layer in the transition region has a protruding length and a ratio between the protruding length and a width of the termination region ranges from 0.1 to 0.8;
an isolation layer disposed on the floating electrode layer; and
at least one transistor structure located in the active region, wherein the transistor structure includes at least one source conductive layer extending from the active region to the transition region and insulated from the floating electrode layer by the isolation layer.

13. A super junction semiconductor device comprising:
a substrate;
a drift layer disposed on the substrate and having a surface at a side opposite to the substrate, wherein the drift layer includes a plurality of n-type pillars and a plurality of p-type pillars extending from the surface toward the substrate and arranged alternately to form a super-junction structure, the drift layer defines an active region, a termination region surrounding the active region, a transition region between the active region and the termination region, and the drift layer includes a first p-type pillar, a second p-type pillar, and a third p-type pillar in the termination region, which are arranged in a direction from a position near to the transition region to another position far away from the transition region;
a field insulator disposed on the surface and covering the termination region and a portion of the transition region;
a floating electrode layer disposed on the field insulator, wherein the floating electrode layer partially overlaps with the termination region, wherein an end of the floating electrode layer is located at a vertical plane between the first p-type pillar and the second p-type pillar;
an isolation layer disposed on the floating electrode layer; and
at least one transistor structure located in the active region, wherein the transistor structure includes at least one source conductive layer extending from the active region to the transition region and insulated from the floating electrode layer by the isolation layer.

* * * * *